United States Patent [19]

Spence

[11] 4,454,524

[45] Jun. 12, 1984

[54] DEVICE HAVING IMPLANTATION FOR CONTROLLING GATE PARASITIC ACTION

[75] Inventor: Wendell Spence, San Jose, Calif.

[73] Assignee: NCR Corporation, Dayton, Ohio

[21] Appl. No.: 884,060

[22] Filed: Mar. 6, 1978

[51] Int. Cl.³ .............................................. H01L 29/78
[52] U.S. Cl. ......................................... 357/23; 357/13; 357/51; 357/54; 357/59; 357/91; 357/23.11; 357/23.5
[58] Field of Search ........................ 357/13, 23, 59, 54, 357/91, 51

[56] References Cited

U.S. PATENT DOCUMENTS

| 3,860,454 | 6/1973 | DeWitt et al. | 357/91 |
| 4,029,522 | 6/1977 | De La Moneda | 357/91 |
| 4,078,947 | 3/1978 | Johnson et al. | 357/59 |
| 4,115,794 | 9/1978 | De La Moneda | 357/51 |
| 4,143,388 | 3/1979 | Esaki et al. | 357/23 |

OTHER PUBLICATIONS

P. Krick, "The Implanted Stepped-Oxide MNOS-FET," IEEE Trans. on Elec. Dev.," Feb. 1975, pp. 62–63.

Primary Examiner—Joseph E. Clawson, Jr.
Attorney, Agent, or Firm—J. T. Cavender; Casimer K. Salys; Philip A. Dalton

[57] ABSTRACT

A memory FET device having a channel implantation which controls gate parasitic transistor action. The parasitic action produces unwanted conduction paths which are formed in the transition regions between the thin memory oxide and the thick field oxide and extend along the sides of the gate region between the source and the drain. By blanket implanting through the oxide, which is relatively thin in the memory oxide region and increases in thickness across the transition region, and by adjusting the implant threshold, a continuous implant layer is formed which lies (1) within the field oxide, (2) at the substrate surface beneath the transition region oxide, and (3) deep within the body of the substrate beneath the gate region. The field oxide dopant and the substrate body dopant have no effect on the threshold voltage of the FET transistor channel, while the substrate surface doping under the transition region raises the threshold voltage of the parasitic device action to prevent interference with the operation of the FET. In a preferred embodiment, the device is MNOS-FET.

9 Claims, 9 Drawing Figures

FIG. 1

PRIOR ART

DEVICE HAVING IMPLANTATION FOR CONTROLLING GATE PARASITIC ACTION

CROSS-REFERENCE TO RELATED APPLICATIONS

The present invention is related to that discussed infra and disclosed in U.S. application Ser. No. 847,206, entitled MNOS DEVICE HAVING CONTROLLED GATE PARASITIC ACTION, filed Oct. 31, 1977, in the name of W. Spence, and assigned to the assignee of the present invention.

BACKGROUND OF THE INVENTION

The invention relates to semiconductor memory devices useful, e.g., as electrically alterable memory elements. In particular, the invention relates to an improved field effect memory transistor in which parasitic transistor action along the gate edges is controlled.

MNOS (metal-nitride-oxide-semiconductor) and SNOS (polySilicon-nitride-oxide-semiconductor) devices are derived from the MIS (metal-insulator-semiconductor) structure. Such devices have a silicon nitride layer interposed between the silicon dioxide gate insulation layer and the gate electrode, thus providing a dual layer gate insulator. The silicon dioxide is relatively susceptible to charge carrier tunneling and has a low charge trapping ability, while the silicon nitride has a relatively high charge trapping ability. As is well-known by those skilled in the art, the memory capabilities of the MNOS and SNOS structures are utilized by forming the silicon dioxide layer sufficiently thin to permit charge tunneling through the silicon dioxide layer. Then, upon application of a suitable gate voltage across the gate electrode and the semiconductor substrate, charge carriers tunnel from the substrate through the silicon dioxide layer or vice versa and are trapped in the silicon nitride proximate the silicon dioxide-silicon nitride interface. The trapped charge remains after the voltage has been removed and is reflected by a charge of opposite polarity in the surface region of the substrate.

The reflected substrate charge alters the threshold conduction voltage of the device. The presence or absence of such a charge can thus be used to "write" or "erase" the device to a desired binary state. That is, the threshold voltage of the device can be changed to either a high value or a low value corresponding to a binary bit of "1" or "0" (or vice versa). This stored bit may then be read by applying a gate voltage which is between the high and the low threshold voltages. If the device turns "on" and conducts, a bit of one value is read or, if the device does not turn on, a bit of the other value is read.

Memory devices using the silicon nitride-silicon oxide gate insulation structure are particularly desirable for their nonvolatility. That is, they will hold a trapped charge and resulting binary state for a long time. Consequently, it is not necessary to continually refresh each device or provide special circuitry or other means to compensate for a power breakdown.

Figure 1:
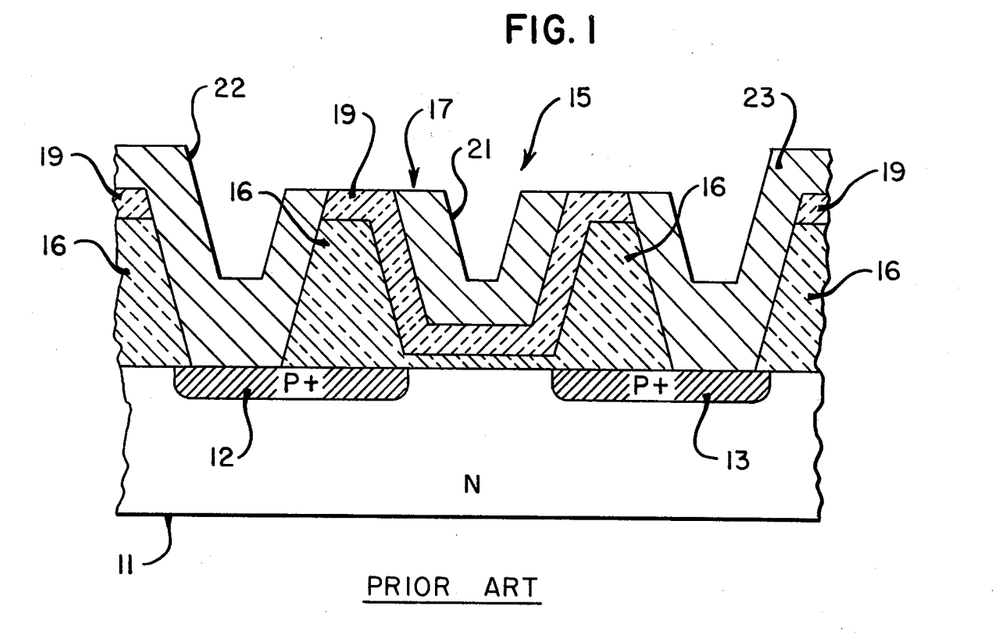
FIG. 1 is a section view taken parallel to the channel of a prior art memory transistor.

Devices, such as memory MNOSFETs or SNOSFETs, which employ relatively thin gate insulation in a well surrounded by thick insulation, may be subject to parasitic transistor action along the edges of the gate. Referring to FIG. 1, there is shown a cross-sectional view of such a memory MNOSFET device 15. The device 15 comprises a substrate 11 of one conductivity type; source 12 and drain 13 of the opposite conductivity type formed in the substrate; thick "field" oxide layer 16 on the substrate for electrically isolating the device; a gate structure 17 comprising thin, charge-tunneling memory oxide layer 18 formed within the field oxide 16, charge-trapping silicon nitride layer 19 and gate electrode 21; and source and drain electrodes 22 and 23, respectively. Parasitic transistor conduction occurs along the opposite edges 24 and 26 (see FIGS. 2 and 3) of the gate structure parallel to the channel as the result of the fringing field which occurs upon application of a polarizing gate voltage across the gate structure, i.e., between gate electrode 21 and substrate 11. The parasitic transistor action results from sloping oxide transition regions which are formed in the field oxide 16 along the edges 24 and 26 of the gate during fabrication of the device 15.

Figure 2:
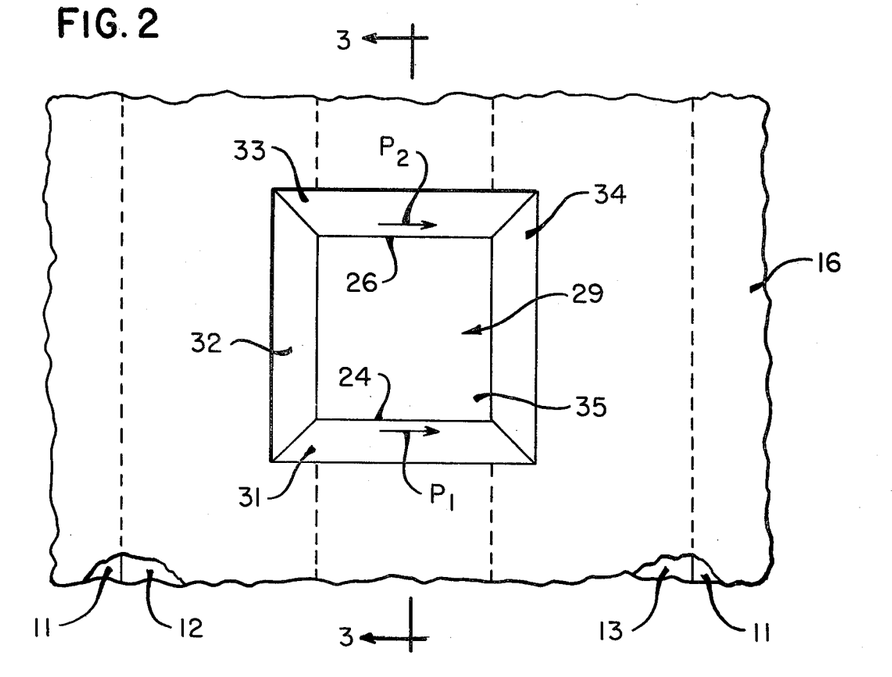
FIG. 2 is a plan view of a chip at an intermediate stage of the fabrication of the devices of FIGS. 1 and 5.
Figure 3:
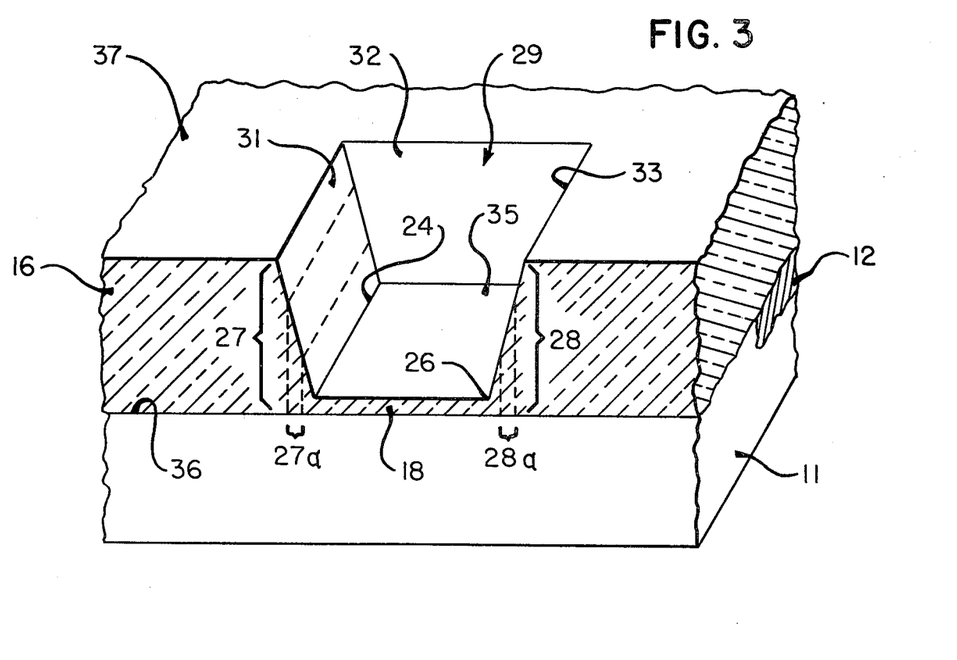
FIG. 3 is a perspective view taken in section along the lines 3-3 of FIG. 2.

Referring now to FIGS. 2 and 3, there are shown, respectively, a plan view, and a perspective view along a section taken parallel to the channel of a semiconductor chip which is at an intermediate stage of fabrication of the prior art memory MNOSFET device 15 (FIG. 1) or the memory MNOSFET device 50 (FIG. 5) of the present invention. In pertinent part, the fabrication typically involves initially forming the field oxide layer 16 on substrate 11, and etching openings in the substrate and diffusing impurities through the openings into the substrate to form the source 12 and drain 13.

Then, in forming the gate structure 17 (FIG. 1) a mask (not shown) is applied to the field oxide 16 and a well 29 is etched in the field oxide to the surface of the substrate 11. As shown in FIG. 3, etching undercuts the field oxide 16 beneath the mask so that the walls 31, 32, 33, 34 of the field oxide well 29 slope outwardly, away from the base region of the well formed between the walls in the direction from the interface region 36 (formed by the inner surfaces of the substrate 11 and the field oxide) to outer surface 37 of the field oxide 16. The sloping walls remain after subsequent growth/deposit in the well of the relatively thin gate oxide(s) (which forms memory oxide 18 in the well and thereby forms base 35 of the well) and after completion of the device 15.

Because of the sloping side walls 31, 32, 33, 34, the transition from thin memory gate oxide 18 (typically 10 to 60 Angstroms) to thick field oxide 16 (typically 10,000 to 20,000 Angstroms) is sloped or gradual rather than abrupt. That is, regions of transition from the thin memory oxide to the thick field oxide are formed along each side of the gate. However, gate parasitic device action is a concern only along the sides of the gate which extend between the source and drain. Accordingly, our discussion here is limited to transition regions 27 and 28 formed beneath walls 31 and 33 along gate sides 24 and 26.

As discussed previously, the memory oxide 18 is formed sufficiently thin to permit charge carrier tunneling between the substrate and the gate structure and thereby impart alterable threshold characteristics to the structure. The field oxide 16 is sufficiently thick to preclude tunneling and any resulting alterable threshold characteristics and, in fact, is sufficiently thick to preclude any inversion of the underlying substrate and creation of a conduction channel therein by normal applied fields. However, each of the transition regions 27 and 28 has a portion (arbitrarily shown as portions 27a and 28a in FIG. 3) which is approximately parallel to the edges 24 and 26 and is thin enough to permit transistor action, but is too thick to permit tunneling and the resulting alterable threshold characteristics. In the presence of a suitable electric field such as the fringing field associated with gate voltages, this non-alterable, non-memory "parasitic" transistor action produces conduction channels in the substrate 11 beneath transition regions 27a and 28a. The channels extend proximate to and approximately parallel to the edges 24 and 26 of the gate between the source 12 and the drain 13.

Referring to the plan view of FIG. 2, the current flow along the channels associated with the parasitic transistors $P_1$ and $P_2$ is represented by arrows. Because the MNOS device 15 is shown here prior to completion, it is inoperative. Parasitic transistors $P_1$ and $P_2$ of course would not be present in the inoperative device, but are shown in the plan view to better demonstrate their physical location and operation in the completed device 15 of FIG. 1.

Figure 4:
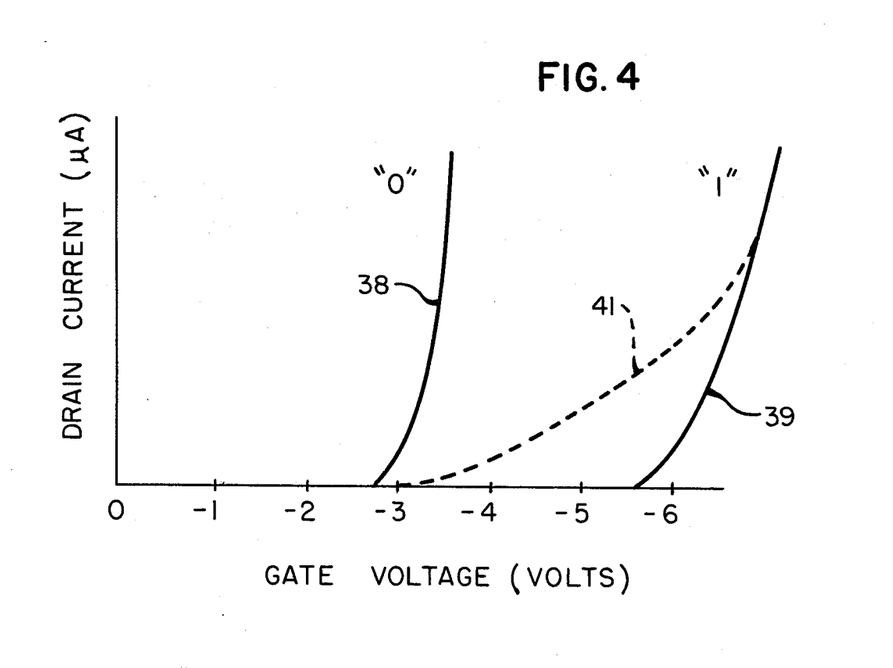
FIG. 4 graphically illustrates drain current as a function of gate voltage and particularly illustrates the parasitic threshold voltage associated with memory transistor devices.

The effect of the parasitic FETs $P_1$ and $P_2$ is shown in FIG. 4. A typical P-channel MNOSFET might be set to a low threshold voltage of approximately −3 volts by application of a polarizing gate voltage of +20 to +30 volts for 100 milliseconds. This is shown by the erase or "0" state curve 38 in FIG. 4. Likewise, by applying −20 volts to −30 volts for 100 milliseconds, a threshold voltage of about −6 volts might be expected for the written or "1" state curve 39. However, the parasitic transistors $P_1$ and $P_2$ typically have a low threshold voltage, perhaps −3 volts in the high threshold, "1" state. This is indicated by the dotted tail 41 of the "1" state curve 39. The parasitic device may then be turned on and conducting at 3-4 $\mu A$ across all or a substantial portion of the window between the "0" and "1" threshold voltages. Any circuit employing the device 15 must use sensing circuitry which is insensitive to such parasitic currents.

An approach for controlling this gate parasitic transistor action is taught in the aforementioned U.S. application Ser. No. 847,206, entitled MNOS DEVICE HAVING CONTROLLED GATE PARASITIC ACTION, filed Oct. 31, 1977 in the name of W. Spence and assigned to the assignee of the present application. Here, the gate memory oxide has sections which project outwardly from the sides of the gate. The perimeter of each projecting section defines elongated transition regions which increase the channel length of the parasitic device and thereby decrease the parasitic drain current. This approach is very efficient in controlling gate parasitic device action without additional process steps, although the projections probably decrease the density achievable using the transistor design.

Another approach is taught by P. J. Krick in "The Implanted Stepped-Oxide MNOS FET", IEEE Transactions on Electron Devices, February, 1973, page 62. There, parasitic FET action is eliminated in N-channel devices and the window widened by implanting a P-type substrate with boron (P-type) ions. This implanting is done at the edge of the memory oxide adjacent to the channel using the gate metalization and field oxide as the implanting mask. The reported purpose of the implantation is to increase the threshold voltage of the region adjacent to the gate metal beyond the high-state threshold voltage of the MNOS FET and thereby prevent inversion of the substrate by fringing fields from the gate electrode. The Krick article does not recognize that the oxide transition regions themselves can be used to control the depth of a blanket implant and thereby to eliminate the problem of parasitic gate action, and without deleteriously affecting the operation of the device.

An approach for controlling parasitic inversion beneath the thick field oxide associated with a semiconductor device is taught in U.S. Pat. No. 3,860,454 issued Jan. 14, 1975, to DeWitt and Johnson. This patent utilizes the difference in thicknesses of the gate and field regions to implant a layer of impurities at different depths in the device. The layer is buried just under the oxide of the field region and deep within the substrate in the gate region. The implanted impurities, which are of the same conductivity as the background doping of the substrate, prevent parasitic inversion and the resulting conduction in the field regions of the substrate without deleteriously affecting the gate region. This patent is not directed to the problem of lateral parasitic transistor action, does not recognize the cause of the problem and, like the Krick article, does not recognize that the cause of the problem may in fact be used in the solution.

SUMMARY OF THE INVENTION

The invention relates to a construction for a composite semiconductor device which utilizes the source of lateral gate parasitic transistor action—the transition regions between the field oxide and the gate oxide—to eliminate the parasitic action. The device comprises a substrate of one conductivity type having a channel region; a variable threshold gate structure overlying the channel region and defining channel region length and including a first, charge tunneling portion; an insulating layer formed on the substrate and having an outer surface topology defining a well, the well having a base which defines the first, charge tunneling portion in the insulating layer and having walls extending from and sloping away from the base along the length of the channel region; and an impurity layer of the one conductivity type underlying and approximately paralleling the walls of the well. The portion of the implant layer located in the substrate surface beneath the walls of the well, and beneath the transistion regions formed thereby between the gate insulation and the field oxide, raises the inversion voltage associated with the parasitic transistor action which forms a conduction channel between the source and drain. In a preferred embodiment, the gate insulator is a dual layer of charge tunneling-permitting oxide and charge trapping nitride and the device in MNOS.

DETAILED DESCRIPTION

Figure 5:
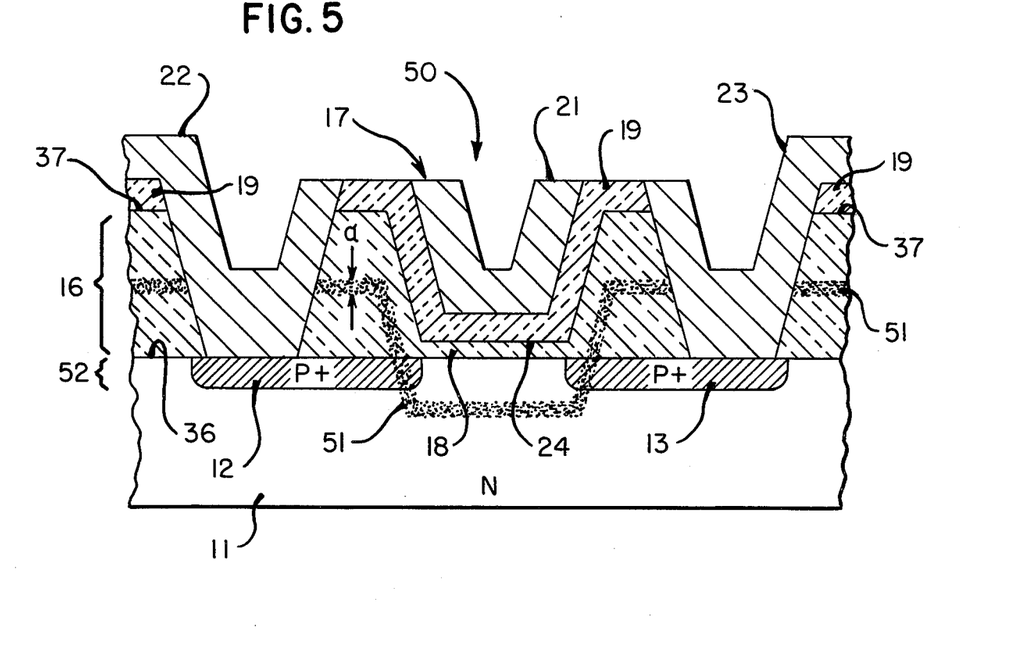
FIG. 5 is a cross-sectional view taken parallel to the channel in a manner similar to FIG. 1 of a memory MNOSFET device having an impurity layer in accordance with the principles of the present invention.

Referring now to FIG. 5, there is shown a cross-sectional view, similar to the view of prior art device 15 shown in FIG. 1, of a memory device 50 embodying the principles of the present invention. The illustrated device is MNOSFET. Throughout, component parts of the device 50 which correspond to parts of the device 15 are given the same reference numerals.

Device 50 has a substrate 11 of a given conductivity type (illustrated as N-type, although obviously P-type could be used), within which spaced-apart surface regions of the opposite conductivity type form source 12 and drain 13. Gate structure 17, comprising memory oxide layer 18, silicon nitride layer 19, and gate electrode 21, overlies the channel region between the source and drain. Electrodes 22 and 23, respectively, are connected to the source and drain for applying biasing voltages to the source and drain which, in cooperation with the gate voltage, form a conduction channel between the source and drain, as described previously. Field oxide 16 provides electrical isolation for the device 50. Other insulating materials, passivating materials, and electrical connections and interconnections (not shown) may be applied as needed to complete the protection of and the integration of the device with other components on the chip 49 (FIG. 6).

Figure 6:
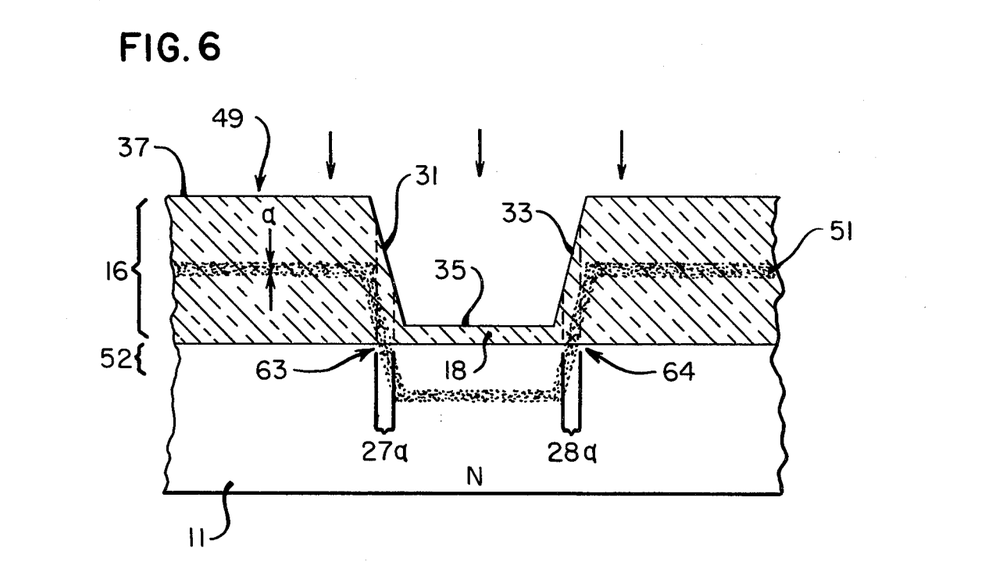
FIG. 6 is a cross-sectional view taken perpendicular to the channel of and illustrating the device of FIG. 5 at the intermediate stage of fabrication at which the impurity layer is formed.

Referring also to FIG. 6, device 50 includes a relatively high concentration impurity layer 51 for raising the threshold voltage of the parasitic transistors $P_1$ and $P_2$ associated with the transition regions 27 and 28 (FIG. 3). The impurities comprising layer 51 are of the same conductivity type as the substrate background impurities. Impurity layer 51 has a first portion which parallels the outer surface 37 of the field oxide 16 and a second, stepped or well portion which parallels the sides 31-34 and bottom 35 of the well 29.

The bottom of the impurity layer well is positioned sufficiently deep within the substrate 11 to prevent interference with the operation of the device 50. The sides of the impurity layer well intersect the surface adjacent region 52 of the substrate 11 at regions 53 and 54 which correspond to (underlie) the portions 27A and 28A of the transition regions which provide fixed threshold, non-memory parasitic transistor action. In other words, the slanting profile of the impurity layer well region is selected to concentrate the impurities at or adjacent the substrate surface directly beneath and parallel to regions 27A and 28A. This surface-adjacent concentration of impurities raises the threshold voltage of the parasitic transistors $P_1$ and $P_2$ to a sufficiently high value to prevent interference with the operation of the circuit(s) which utilizes the device 50. Specifically, the surface adjacent concentrations 53 and 54 of impurities raise the parasitic threshold voltage (the gate voltage level at which the substrate surfaces along edges 24 and 26 beneath regions 27A and 28A are inverted to P-type to form the conduction channels associated with the parasitic "devices" $P_1$ and $P_2$) sufficiently high to preclude interference with the detection of the "on" or "off" state of the device 50 by the sensing circuits used for the device.

In fabricating the device 50 shown in FIG. 5, initially the substrate 11 is provided a background dopant concentration level by introducing impurity dopants of the given conductivity type. For the illustrative N-type substrate 11, the impurity may be selected from group V donor elements such as P, As, or Sb. For P-type substrates, the impurity may be selected from group III acceptor elements such as B, Al, Ga, and In. Typical impurity concentration levels are $4 \times 10^{14}$ to $4 \times 10^{15}$ atoms per cubic centimeter (cc).

Next, the field oxide 16 is formed (deposited on and/or formed by growth from) the substrate 11. The field oxide depth in the completed device 50 is typically 10,000 to 20,000 Angstroms (1 to 2 microns), but the thickness of this initial formation is less than the final value to allow for additions to the thickness which occur during subsequent processing.

The source 12 and the drain 13 are then formed by etching apertures in the field oxide 16 using standard photolithographic techniques, then introducing impurities into the substrate 11 of the opposite conductivity type from those which provide the background doping of the substrate. For an N-type substrate 11, the source 12 and the drain 13 may be formed by introducing group III acceptor ions to a concentration of $10^{19}$ to $10^{22}$ atoms per cc. For a P-type substrate 11, the source and drain may be formed by introducing group V donor ions to approximately the same concentration levels.

After formation of the source and drain standard photolithographic techniques are used, as discussed previously, to form the gate well 29.

Referring also to FIG. 6, there is shown a cross-sectional view, similar to FIG. 3, of a chip 49 at the intermediate stage of fabrication of the device 50 in which the impurity layer 51 is formed. FIG. 6 is taken at right angles to the view of FIG. 5, perpendicular to the channel of the device. As a result the source 12 and drain 13 are not shown. The impurities of layer 51 are of the same conductivity type—herein N-type—as the substrate impurities. The layer 51 is formed by ion bombardment (indicated by the arrows) subsequent to the formation of the well 29. As shown, layer 51 lies within the field oxide 16 beyond the sides of the gate, then extends beneath the sloping walls of the well 29 and intersects the substrate beneath transition regions 27 and 28 (27a and 28a), then descends further and is buried deep in the substrate beneath the gate region.

The layer 51 may be applied using a mask (not shown) to confine the layer to the gate region or may be applied without as mask as shown in FIG. 6 if the presence of the layer is not detrimental to other regions/devices of the chip.

In general, the depth to which the impurity layer 51 is implanted within materials depends upon the characteristics of the materials and the bombardment energy imparted to the impurities. The layer 51 is most conveniently formed if the implantation is done through a single material. Thus, the layer 51 is conveniently formed subsequent to (1) the formation of the well 29 or (2) the formation of gate oxide layer(s), i.e., before other materials are in place on the oxide surface 37. At this stage of the fabrication, the implantation is done through components (substrate 11 and field oxide 16) which are formed of silicon dioxide, so material differences are not a factor in creating the desired profile for layer 51. Then, by the proper choice of the implantation energy, the topology of the field oxide layer 16 and the well 29 therein (including the very slope of the walls 31 and 32 which provides the transition regions 27 and 28 and thus the parasitic transistor action) can be used to provide the stepped or well-like profile required to elevate the threshold voltage of the parasitic devices. That is, the outer surface 37 of the field oxide 16, including walls 31-34 and (1) the upper surface of the substrate 11 or (2) well base 35 (depending upon whether the layer 51 is formed subsequent to formation of (1) the well 29 or (2) the gate oxide layer(s) in the well) impart the required profile to layer 51. The layer 51 can thus be placed at the desired depth in the substrate surface beneath the walls 31 and 33 and at the same time be placed sufficiently deep in the substrate beneath (1) the upper surface thereof or beneath (2) well base 35 to elevate the threshold voltage associated with the lateral gate parasitic action, yet not deleteriously affect the operation of the device.

It should be mentioned that the inner edges of the non-memory transition regions 27a and 28a are located very close to the opposite ends of the memory gate oxide 18, for these transition regions begin at about 50-60 Angstroms of oxide thickness and the memory gate oxide is only about 10-60 Angstroms thick. Because the impurity layer 51 is buried about 10,000 Angstroms beneath the oxide outer surface 37 and, thus, about 9990-9940 Angstroms beneath the edges of the non-memory transition regions 27a and 28a, one might expect the impurity layer to be buried too deep beneath the transition layers to affect inversion. However, as indicated in FIGS. 5 and 6, the impurity layer is relatively thick. The impurity layer thickness "a" (measured parallel to the direction of penetration of the implanted ions, which is generally perpendicular to the interface 36) is provided by a thin region or line of peak concentration extending along the length of the impurity layer and gradients of decreasing impurity concentration extending to either side of the region of peak concentration. Also, the slope of the walls of well 29 (the acute angle between walls such as 31 and 33 and the horizontal as defined by substrate-oxide interface 36, FIGS. 5 and 6) is greater than shown in the drawings. Because of the steepness of the walls, the implanted impurity layer 51 is sufficiently close to the ends of the memory oxide 18 so that the relatively thick implant layer 51 does lie beneath and is effective in increasing the threshold voltage of the transition regions 27a and 28a. The desired control of the associated parasitic conduction is thus provided, even at the inner edges of the transition regions next to the ends of the memory oxide layer 18.

The device 50, FIG. 5, is then completed by forming the gate structure 17; forming electrodes 22 and 23 by etching apertures to the surface 36 of the substrate and forming the electrodes therein; and forming other connections, interconnections, passivation layers, etc. as required. Typically, for an MNOS device 50, the gate electrode 19 and the source and drain electrodes 22 and 23 will be a refractory metal such as aluminum. Those skilled in the art will readily tailor the fabrication process to their specific needs. Suitable dimensions for the field oxide 16, the gate electrode 21, the memory oxide 18, and the silicon nitride are 10,000-20,000 Angstroms, 10,000-20,000 Angstroms, 10-60 Angstroms, and 400-1,000 Angstroms, respectively.

As one example of the device 50, substrate 11 is provided a N-type background of $2 \times 10^{15}$ phosphorus atoms per cc. Field oxide 16 is about 1.5 microns thick. Memory oxide 18 is about 10-20 Angstroms thick. Silicon nitride layer 19 is about 400-600 Angstroms thick. Gate electrode 21 is about $1.5\mu$ thick, while metal contacts 22, 23 and 24 are also about $1.5\mu$ thick. The gate region (defined by the sides, including sides 24 and 26, of the gate structure 17) is approximately $10\mu$ long parallel to the channel length (i.e., in the direction between the source and drain) and $10\mu$ wide (perpendicular to the channel length). The source 12 and drain 13 are formed to a depth of about 2-2.5 microns. The depletion region associated with this configuration is about one micron (10,000 Angstroms) deep. Layer 51 is implanted, e.g., using a doubly ionized phosphorus process and applying an implantation energy of about 200-300 keV for sufficient time to duplicate the profile of surface 37 (including the profile of well 29) at a depth of at least about one micron below the surface 37.

The layer 51 has a portion below and parallel to the planar portion of the surface 37 and descends beneath the side walls of the well 29 to form surface-adjacent regions 63 and 64 which are beneath the transition regions 27a and 28a. The walls of the well-like portion of layer 51 are parallel to and about one micron beneath the walls 31 and 33 of the well 29. The layer 51 extends from the surface-adjacent regions 53 and 54 into the substrate beneath the substrate upper surface 36. The resulting continuous stepped layer 51 provides the concentration of impurities at the surface of the substrate necessary to elevate the threshold voltage of the gate parasitic transistor action associated with device 50. The layer 51 is also buried about one micron below the well base 35, which is sufficiently deep to preclude interference with the depletion layer and the performance of the device 50. Without the layer 51, the parasitic threshold voltage is about $-3$ volts (FIG. 4), while with the layer 51, the threshold voltage is about $-6$ V.

Device 50 is not limited to MNOS technology, nor to a particular configuration such as the planar configuration of the memory oxide 18. For example, the principles of the present invention may be applied to other memory devices having parasitic gate action resulting from a relatively thin gate insulator which is surrounded by a relatively thick field insulator. The invention is applicable to technologies such as SNOS (polySilicon gate electrode—silicon Nitride-silicon Oxide gate insulator—Semiconductor). Instead of the uniformly thin memory gate oxide 18, the invention may be practiced with a gate oxide having one or more portions which are of different thickness than 18. Examples of different gate oxide thicknesses include the dual gate (FIGS. 7A and 7B) and trigate (FIG. 8) structures taught in U.S. Pat. No. 3,719,866 issued Mar. 6, 1973 to Naber and Lockwood and assigned to the assignee of the present invention. U.S. Pat. No. 3,719,866 is incorporated by reference.

Figure 7A:
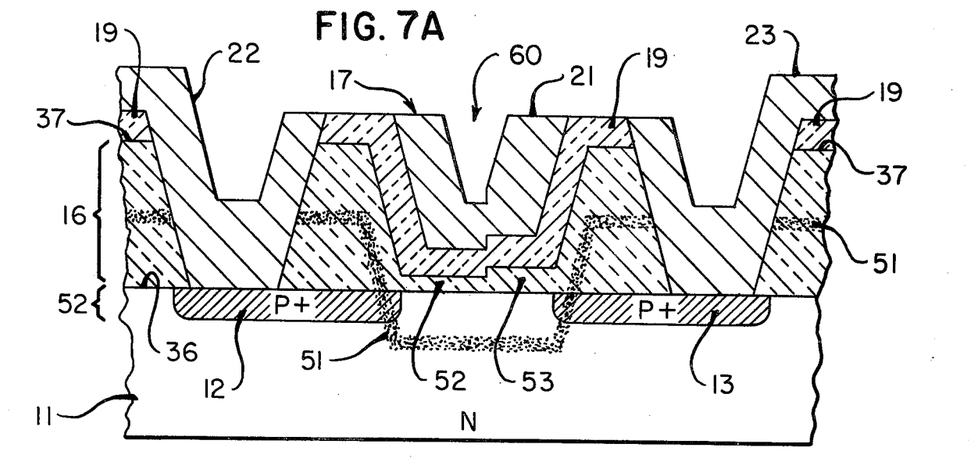
FIGS. 7A and 7B are cross-sectional views of alternative, dual gate embodiments of the memory MNOSFET of FIG. 5.
Figure 7B:
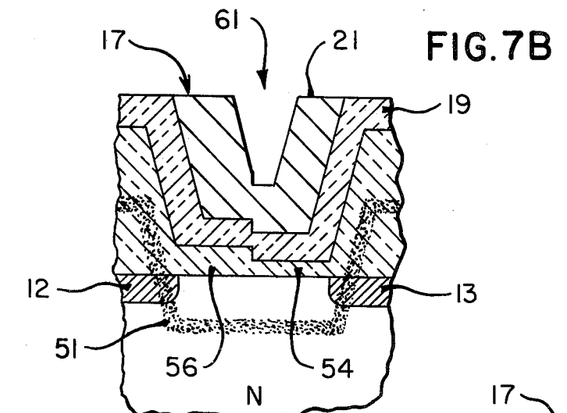
Figure 8:
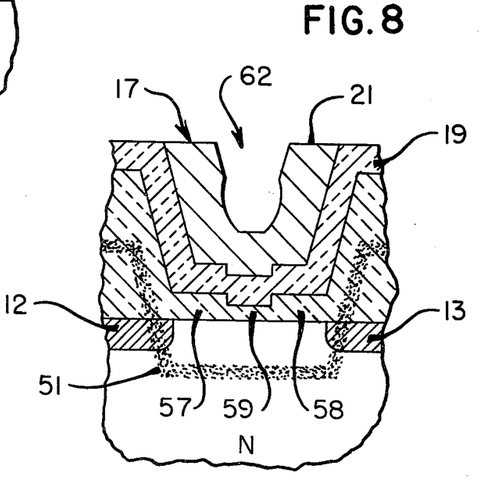
FIG. 8 is a cross-sectional view of an alternative, trigate embodiment of the memory MNOSFET of FIG. 5.

FIG. 7A shows a Naber-Lockwood dual gate structure 60 having a gate oxide which comprises a relatively thin, alterable threshold memory oxide portion 52, and a relatively thick, non-alterable threshold non-memory oxide portion 53 which is proximate the junction of the substrate 11 and drain 13. The thick non-memory oxide portion 53 prevents low-voltage Zener breakdown of the substrate-drain junction. FIG. 7B shows a dual gate structure 61 having a thin memory oxide portion 54 and a thick non-memory oxide portion 56 which is proximate the substrate-source junction for preventing low voltage Zener breakdown thereof. FIG. 8 shows a trigate structure 62, i.e., thick non-memory oxide portions 57 and 58 for the source and drain junctions, respectively, and an intermediate thin memory oxide portion 59.

In forming the gate oxide for the dual gate and the trigate structures, initially oxide is formed to the non-memory thickness of about 200–1000 Angstroms on the upper surface 36 of the substrate within the well 29. This non-memory gate oxide is then etched to the substrate through a mask to define the memory oxide region and the memory oxide is formed (regrown or deposited) on the substrate within the etched region to a thickness of 10–60 Angstroms. This process leaves a predetermined pattern of non-memory oxide (gate oxide portions 53 (FIG. 7A); 56 (FIG. 7B); 57 and 58 (FIG. 8)) in the gate region outside the memory oxide portion. Layer 51 can be implanted after formation of either the non-memory gate oxide or the memory oxide, it may be desirable to form the layer after the non-memory gate oxide formation (before the memory oxide formation), since the gate oxide outer surface (well base 35) is planar at this point and layer 51 is implanted to a uniform depth beneath substrate surface 36.

Other modifications within the scope and spirit of the present invention will be readily achieved by those skilled in the art.

Having described preferred and alternate embodiments of the invention, what is claimed is:

1. A semiconductor memory device, comprising:
   a semiconductor substrate of a predetermined conductivity type and having a channel region;
   a gate structure overlying the channel region and defining channel region length and including a first, charge tunneling portion;
   an insulating layer on the substrate and having an outer surface defining a well, the well having a base which defines the first, charge tunneling portion in the insulating layer and having walls extending from and sloping away from the base along the length of the channel region; and
   an impurity layer of the predetermined conductivity type underlying and approximately paralleling the walls of the well such that the layer forms a substrate surface adjacent concentration of impurities beneath the walls of the insulating layer for controlling parasitic inversion of the underlying substrate.

2. In a memory device comprising a substrate of predetermined conductivity type having a conduction channel region of predetermined length therein; a gate structure spanning the length of the channel region and having opposite sides approximating channel width, the gate structure comprising a layer of oxide on the substrate, a charge trapping layer overlying the oxide layer and a gate electrode overlying the charge trapping layer; the gate oxide layer including a relatively small thickness, charge-tunneling portion extending over at least a portion of the width of the channel along at least an intermediate portion of the channel length; a thick insulating oxide layer proximate the width-defining sides of the gate structure; and a transition oxide layer connecting, and increasing in thickness from, the gate oxide layer to the relatively thick insulating oxide layer, the improvement comprising:
   an impurity layer of the same conductivity as the substrate implanted in the device beneath the gate structure, the depth of the implanted impurity layer within the device being determined by the thickness of the oxide layers such that the implanted impurity layer forms an inversion voltage-increasing surface adjacent region in the substrate beneath the transition layer for substantially eliminating parasitic transistor action associated with the transition oxide.

3. A structure for an information storage semiconductor memory device, comprising:
   a semiconductor substrate of predetermined conductivity type having a pair of spaced-apart surface regions of the opposite conductivity type defining a channel region of length determined by the spacing between the surface regions;
   an oxide layer having first and second opposite sides and being joined to the substrate along the first side;
   the oxide layer having a well defined by a base and walls formed in the second side thereof, the base overlying the channel region and the walls extending from and slanting away from the base in the direction from the first side of the oxide layer to the second side;
   a gate structure extending in length between the surface regions and having opposite sides which impart width to the channel region, the gate structure comprising (1) a charge storage gate insulator including the portion of the oxide layer between the well base and the second side of the oxide layer and (2) a gate electrode overlying the gate insulator;
   the gate electrode and the substrate being adapted for applying a polarizing voltage therebetween across the gate insulator;
   the gate insulator having at least a section thereof of suitable thickness for permitting charge tunneling between the substrate and the gate insulator upon application of a suitable polarizing voltage between the substrate and gate electrode; and
   an impurity layer of the predetermined conductivity type lying beneath and approximately paralleling at least one of the walls of the well and the base of the well such that the impurity layer forms an inversion-voltage increasing surface adjacent region in the substrate beneath the wall for substantially eliminating parasitic transistor action associated with the oxide well.

4. The structure of claim 3, wherein the gate insulator has at least a section thereof of suitable thickness for preventing charge tunneling.

5. The structure of claim 3, wherein the gate insulator comprises:
   a layer of silicon oxide having at least a section thereof of suitable thickness for permitting charge tunneling; and
   a layer of silicon nitride formed on the layer of silicon dioxide.

6. The structure of claim 5 where the gate electrode is silicon.

7. The structure of claim 5 wherein the gate electrode is aluminum.

8. The structure of claim 5 wherein the oxide layer, the gate electrode, the gate insulator silicon oxide layer, the charge tunneling section of the silicon oxide layer, and the silicon nitride layer are 10,000–20,000 Angstroms, aluminum 10,000–20,000 Angstroms, 200–1,000 Angstroms, 10–60 Angstroms, and 400–1000 Angstroms thick, respectively.

9. A semiconductor device comprising:
   a semiconductor substrate of a predetermined conductivity type;

an insulating layer formed on the substrate and having an outer surface topology defining a well, the well having a base which defines a region of charge tunneling oxide on the substrate and having walls extending from and sloping away from the base;

a gate structure overlying the well and including the charge tunneling oxide region and a layer of charge trapping material overlying the charge tunneling oxide region, the charge trapping layer being formed subsequent to formation of the insulating layer well; and an impurity layer of the predetermined conductivity type implanted within one or both of the insulating layer and the substrate prior to formation of the charge trapping layer using an acceleration energy sufficient to implant the layer at a predetermined depth beneath the outer surface of the insulating layer, the predetermined depth providing a substrate surface adjacent concentration of impurities beneath the walls of the insulating layer well for controlling parasitic inversion of the underlying substrate.

* * * * *